(12) United States Patent
Moriguchi et al.

(10) Patent No.: US 6,707,128 B2
(45) Date of Patent: Mar. 16, 2004

(54) VERTICAL MISFET TRANSISTOR SURROUNDED BY A SCHOTTKY BARRIER DIODE WITH A COMMON SOURCE AND ANODE ELECTRODE

(75) Inventors: Kouji Moriguchi, Yokohama (JP); Yoshitaka Hokomoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 10/164,633

(22) Filed: Jun. 10, 2002

(65) Prior Publication Data
US 2002/0190340 A1 Dec. 19, 2002

(30) Foreign Application Priority Data
Jun. 13, 2001 (JP) .......................... 2001-179014

(51) Int. Cl.⁷ .................. H01L 27/095; H01L 29/47; H01L 29/812; H01L 31/07; H01L 31/108; H01L 21/28; H01L 21/44

(52) U.S. Cl. .................. 257/484; 257/486; 257/483; 257/127; 257/130; 257/589; 257/605; 257/328; 438/138; 438/268; 438/270; 438/570

(58) Field of Search ................ 257/484, 486, 257/339, 341, 483, 127, 128, 130, 589, 605, 328, 329, 330; 438/138, 268, 270, 570

(56) References Cited
U.S. PATENT DOCUMENTS

| | | | |
|---|---|---|---|
| 5,164,802 A | 11/1992 | Jones et al. | 257/337 |
| 5,170,241 A | * 12/1992 | Yoshimura et al. | 257/339 |
| 5,925,910 A | 7/1999 | Menegoli | 257/335 |
| 6,476,456 B1 | * 11/2002 | Boden, Jr. | 257/486 |

FOREIGN PATENT DOCUMENTS

JP  10-41527  2/1998

* cited by examiner

Primary Examiner—Nathan J. Flynn
Assistant Examiner—Victor A. Mandala, Jr.
(74) Attorney, Agent, or Firm—Oblon, Spivak, McClelland, Maier & Neustadt, P.C.

(57) ABSTRACT

A semiconductor device comprises a first semiconductor layer of a first conductivity type provided on a semiconductor substrate of the first conductivity type, a base layer of a second conductivity type provided in the first semiconductor layer, for defining a vertical MISFET including source regions and a gate electrode on a gate insulation film, a Schottky barrier diode (SBD)-forming region provided in the first semiconductor layer around the base layer, a guard ring region of the second conductivity type provided around SBD-forming region, a first main electrode disposed above the first semiconductor layer and provided in common as both a source electrode of the MISFET and an anode of the SBD, a surface gate electrode disposed above the first semiconductor layer, and a second main electrode provided in common as a drain electrode of the MISFET and a cathode of the SBD.

28 Claims, 5 Drawing Sheets

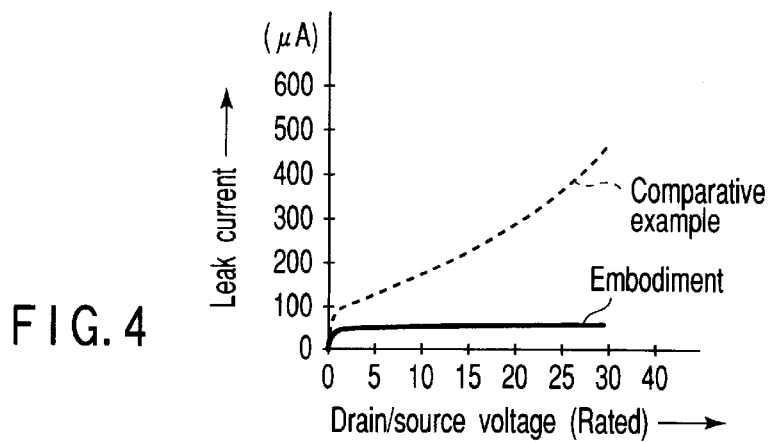
FIG. 4
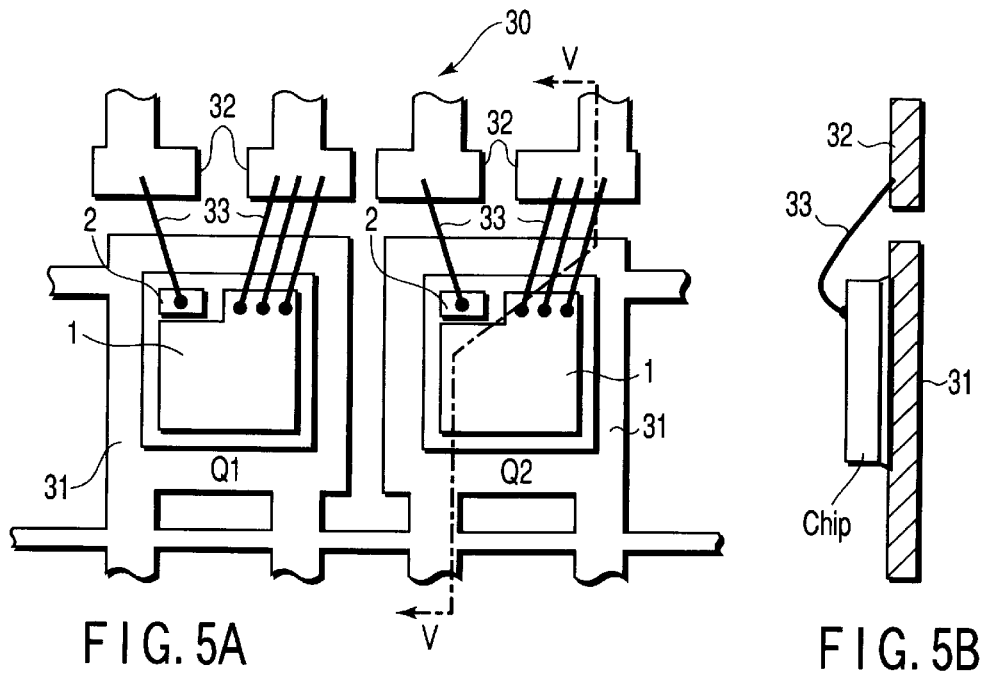
FIG. 5A
FIG. 5B
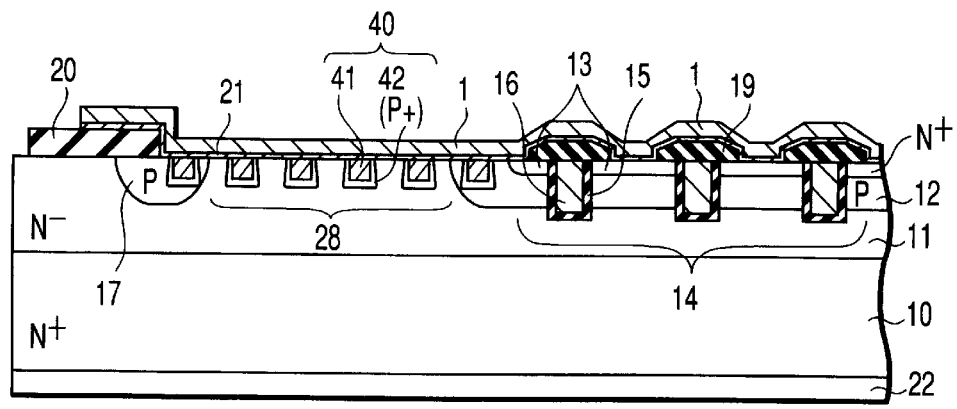
FIG. 6

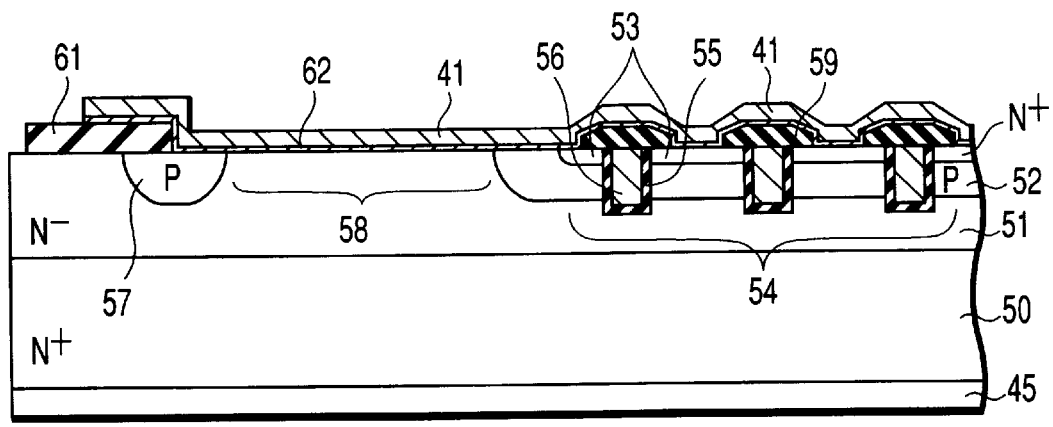
FIG. 10 PRIOR ART
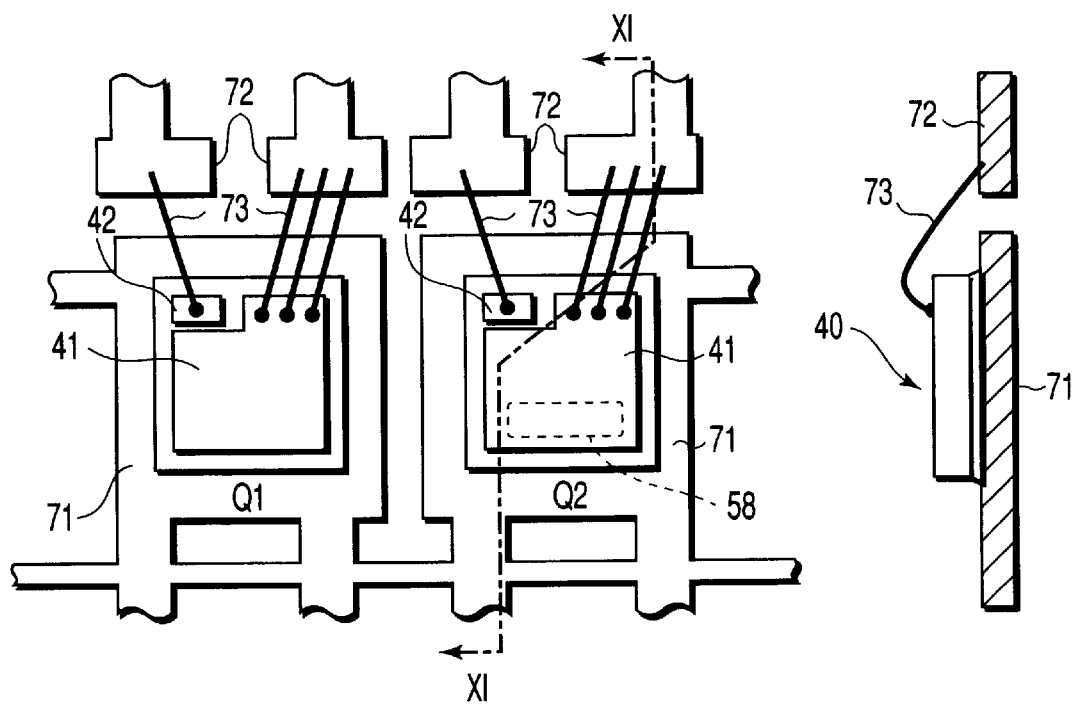
FIG. 11A
PRIOR ART
FIG. 11B
PRIOR ART

VERTICAL MISFET TRANSISTOR SURROUNDED BY A SCHOTTKY BARRIER DIODE WITH A COMMON SOURCE AND ANODE ELECTRODE

CROSS-REFERENCE TO RELATED APPLICATIONS

This application is based upon and claims the benefit of priority from the prior Japanese Patent Application No. 2001-179014, filed Jun. 13, 2001, the entire contents of which are incorporated by reference.

BACKGROUND OF THE INVENTION

1. Field of the Invention

The present invention relates to a semiconductor device, and more particularly to a semiconductor device which includes MISFET (insulated gate field effect transistor) and Schottky barrier diode (SBD) on a single semiconductor chip, and which is for use in, for example, a synchronization rectifier circuit.

2. Description of the Prior Art

As a power semiconductor device, a MISFET with a vertical structure for flowing a large current in a vertical direction of the semiconductor substrate, an IGBT driven by a MIS gate, etc have been utilized. As the gate structure of the power MISFET used when a breakdown voltage of, for example, about 30–40 V is needed, a planar structure and trench structure are widely known. In the planar structure, a flat gate electrode is used. In the trench structure, a gate electrode is buried in a trench to employ the sidewall of the trench as a channel region, in order to achieve a fine and low-loss structure.

The power MISFET with the trench structure has a number of juxtaposed MISFET cells in the semiconductor substrate. This structure is considered more advantageous than the power MISFET of the planar structure in that the performance can be enhanced (the loss can be reduced) simply by reducing the channel resistance.

The MISFET can be used as a step-down synchronization rectifier DC—DC converter circuit that is for use in, for example, a portable electronic device for efficiently converting a high DC input voltage into a low DC output voltage.

FIG. 8 shows an example of a connection relationship between the synchronization rectifier circuit and the load circuit.

In this case, an NMISFET as an "H" side transistor Q1 is connected between a DC power supply (not shown) and output terminal OUT, a Schottky barrier diode (SBD) 80 is reversely connected between the output terminal OUT and a ground potential GND, and an NMISFET as an "L" side transistor Q2 for switching is connected in parallel with the SBD 80. Each of the parasitic PN-junction diodes D1 and D2 is provided between the source/drain of a corresponding one of the transistors Q1 and Q2. Further, an inductor such as a coil L, serving as a load circuit, and a smoothing capacitor C are connected in series between the output terminal OUT and ground potential GND.

As well known, in the synchronization rectifier circuit shown in FIG. 8, the "H" side transistor Q1 is intermittently and cyclically driven by a pulse signal having a duty ratio controlled in accordance with a desired output voltage, thereby providing the desired output voltage to the smoothing capacitor C.

While the "H" side transistor Q1 for load driving is in the ON state, a driving current is supplied from the DC power supply to the load circuit (coil L) via the "H" side transistor Q1, thereby accumulating energy in the coil L. During the time from when the "H" side transistor Q1 has been turned off, to when "L" side transistor Q2 has been turned on, the energy accumulated in the coil L (counterelectromotive force) is discharged from the ground potential GND via the parasitic PN diode D2 of the "L" side transistor Q2 and the SBD 80. This parallel connection of the transistor Q2 and SBD 80 reduces the power loss.

If the "L" side transistor Q2 and SBD 80 are formed on different chips and assembled in different packages, the degree of freedom of design is limited in cost, mount area (occupied space), etc.

Further, if the "L" side transistor Q2 and SBD 80 are formed on different chips, and are mounted on a single lead frame in an electrically separated condition, it is necessary to connect, using an external wire, between the source of the transistor Q2 and the anode of the SBD 80, and also between the drain of the transistor Q2 and the cathode of the SBD 80 (for example, to connect them to the lead frame by wire bonding), thereby increasing the resistance or inductance component of the entire circuit.

For eliminating the necessity of connecting the transistor Q2 and SBD 80 by the external wire to reduce the cost, the mount area and the resistance or inductance component of the wiring layer, an NMISFET/SBD-mounted semiconductor device has been proposed, in which the transistor Q2 and SBD 80 are provided on a single semiconductor chip, and the source and drain electrodes of the transistor Q2 are made to also serve as the anode and cathode of the SBD 80, respectively.

FIG. 9 illustrates perspectively an example of a pattern layout on a chip employed in the conventional NMISFET/SBD-mounted semiconductor device.

On a semiconductor chip 40, an SBD is provided in an SBD-forming region 44 (indicated by the broken line in FIG. 9) that is a part of the FET-forming region for forming an NMISFET. On the top surface of the chip, a first common main electrode 41, which serves as both the source electrode of the NMISFET and the anode of the SBD, is provided, and the surface gate electrode 42 of the NMISFET is provided, isolated from the first main electrode 41 by an insulation film 43. On the reverse surface of the chip, a second common main electrode (see FIG. 10), which serves as both the drain electrode of the NMISFET and the cathode of the SBD, is provided.

FIG. 10 is a schematic sectional view taken along line X—X of FIG. 9.

Specifically, it shows several NMISFET cells of the trench gate structure and an SBD provided on an N$^+$/N$^-$ substrate that is obtained by growing an epitaxial N$^-$ layer on an N$^+$ semiconductor substrate.

In FIG. 10, reference numeral 50 denotes a semiconductor substrate, reference numeral 51 an N$^-$ layer (epitaxial layer), reference numeral 52 a P base layer formed in the N$^-$ layer in the FET-forming region, and reference numeral 53 N$^+$ source regions in the P base layer. Further, gate trenches extend from the surfaces of the N$^+$ source regions 53 to the N$^-$ layer 51.

Reference numeral 55 denotes a gate insulation film provided on the inner wall of each gate trench, and reference numeral 56 a trench gate electrode made of doped polysilicon and buried in each gate trench. Polysilicon wiring layer (not shown) extends from each trench gate electrode to a position away from the gate trench array.

Reference numeral 57 denotes a guard ring region formed in the N$^-$ layer along the entire (or part of the) peripheral portion of the chip, and an island-shaped SBD-forming region 58 is provided between the guard ring region 57 and FET-forming region 54.

Reference numeral 59 denotes an interlayer insulation film provided on the substrate in the FET-forming region, and contact holes are formed in predetermined portions of the film. Reference numeral 61 denotes an oxide film provided on the portion of the substrate that includes part of the guard ring region 57.

A barrier metal 62 is continuously provided over part of the guard ring region 57, the N− layer 51 in the SBD-forming region 58, part of each N+ source region 53, and part of the P base layer 52.

The aforementioned first main electrode 41 made of a metal (such as aluminum), which serves as both the SBD anode and FET source electrode, is provided on the barrier metal 62. Further, the surface gate electrode 42 (see FIG. 9) is provided on the polysilicon gate wiring layer (not shown) in the FET-forming region 54, and is isolated from the first main electrode 41 by the interlayer insulation film 43 (FIG. 9).

Furthermore, on the reverse surface of the chip, the aforementioned second common main electrode 45, which serves as both the FET drain electrode and SBD cathode, is provided.

In the above-described NMISFET/SBD-mounted semiconductor device, the drain current flowing from the FET drain electrode (second main electrode 45) to the source electrode (first main electrode 41) can be ON/OFF controlled using a control voltage applied to the surface gate electrode 42.

Specifically, when a predetermined control voltage is applied to the surface gate electrode 42 with a predetermined voltage applied between the drain and source electrodes of the FET, a drain current flows through an inversion layer formed on the surface portion (channel region) of the P base layer that abuts against each gate trench. Since at this time, a reverse bias voltage is applied to the SBD (denoted by reference numeral 80 in FIG. 8), the SBD is in the OFF state.

When the supply of the voltage to the surface gate electrode 42 is stopped, the FET becomes OFF. If, in this state, a predetermined forward bias voltage is applied between the source electrode 41 and drain electrode 45 of the FET (i.e., between the anode 41 and cathode 45 of the SBD), a forward current flows through the parasitic PN diode (D2 in FIG. 8) of the FET and SBD 80, thereby turning on them.

However, in the above-described semiconductor device, the source electrode 41 of the FET and anode of the SBD are formed of the first main electrode 41, the leak current assumed when the reverse bias voltage is applied between the source electrode 41 and drain electrode 45 of the FET (i.e., the anode 41 and cathode 45 of the SBD 80) is determined by the leak current of the SBD 80, which is inherently relatively large.

Moreover, when the semiconductor chip 40 shown in FIG. 9 is mounted on, for example, a SOP (Small Outline Package) type package, the following problem will occur.

FIG. 11A is a plan view illustrating the arrangement and connection of the semiconductor chip 40 and a lead frame when the semiconductor chip 40 shown in FIG. 9 is mounted on a SOP type package.

FIG. 11B is a sectional view taken along line XI—XI of FIG. 11A.

As shown, the second main electrode 45 on the chip reverse surface is mounted on the bed 71 of the lead frame in such a manner that the surface gate electrode 42 of the FET is positioned closer to the inner leads 72 of the lead frame than to the SBD-forming region 58. Thus, the second main electrode 45 is connected to the drain/cathode terminal (not shown) via the lead frame.

Further, the surface gate electrode 42 and inner lead 72 are bonded by a bonding wire 73, while the first main electrode 41 and inner lead 72 are also bonded by a plurality of bonding wires 73. The reason why a plurality of bonding wires 73 are used to bond the first main electrode 41 to the lead frame is to reduce the wiring resistance and to increase the current capacity. Thus, the surface gate electrode 42 is connected to the gate terminal (not shown) via the outer lead, and the first main electrode 41 is connected to the source/anode terminal (not shown) via the outer lead.

Thereafter, the semiconductor chip 40, and the bed 71, inner leads 72 and bonding wires 73 of the lead frame are covered with a molded resin (not shown), whereby they are packaged and cut into individual semiconductor devices.

As seen from FIG. 11A, the bonding wires 73 connecting the first main electrode 41 to the lead frame are often bonded to the end portion of the first main electrode 41 close to the inner leads 72.

Therefore, since the anode portion of the first main electrode 41 on the SBD-forming region is located at an end remote from the inner leads 72, the electrical resistance of the portion extending from the anode portion to the inner leads 72 will be increased. This will relatively enlarges the voltage drop occurring when a forward current flows to the BSD, thereby putting the electrical resistances of the BSD and each FET cell out of balance. As a result, the characteristics of the FET cells will be unbalanced.

As described above, in the conventional semiconductor device in which the MISFET and SBD are provided on the same semiconductor chip, the source electrode of the MISFET being formed integrally with the anode of the SBD, and the drain electrode of the MISFET being formed integrally with the cathode of the SBD, the leak current flowing when the reverse bias voltage is applied between the source and drain electrodes of the MISFET will be determined by the large leak current of the SBD.

Further, if the semiconductor chip is mounted on the lead frame and packaged, the voltage drop occurring when the forward current flows to the SBD will be relatively large, thereby putting the characteristics of the FET cells out of balance.

BRIEF SUMMARY OF THE INVENTION

A semiconductor device comprising: a first semiconductor layer of a first conductivity type provided on a semiconductor substrate of the first conductivity type; a base layer of a second conductivity type provided in the first semiconductor layer, the base layer defining a vertical MISFET including a plurality of source regions and a gate electrode provided on a gate insulation film; a Schottky barrier diode (SBD)-forming region provided in the first semiconductor layer around the base layer; a guard ring region of the second conductivity type provided around the SBD-forming region; a first main electrode disposed above the first semiconductor layer to cover both the SBD-forming region and the source regions, the first main electrode being provided in common as both a source electrode of the MISFET and an anode of the SBD; a surface gate electrode disposed above the first semiconductor layer to be isolated from the first main electrode by an insulation film, the surface gate electrode being electrically connected to the gate electrodes; and a second main electrode provided in common as both a drain electrode of the MISFET and a cathode of the SBD.

BRIEF DESCRIPTION OF THE SEVERAL VIEWS OF THE DRAWING

FIG. 4 is a graph illustrating the leak currents that occur when a rated voltage is applied between the drain and source electrodes employed in the semiconductor devices of FIGS. 2 and 10;

FIGS. 5A and 5B are plan and sectional views illustrating the arrangement and connection of a semiconductor chip and lead frame when the semiconductor chip is mounted on an SOP-type package;

FIG. 6 is a schematic sectional view illustrating several cells incorporated in an NMISFET and an SBD according to a second embodiment of the invention;

FIG. 10 is a schematic sectional view taken along line X—X of FIG. 9; and

FIGS. 11A and 11B are plan and sectional views illustrating the arrangement and connection of a semiconductor chip and lead frame when the conventional semiconductor chip is mounted on an SOP-type package.

DETAILED DESCRIPTION OF THE INVENTION

The embodiments of the invention will be described in detail with reference to the accompanying drawings.

Figure 1:
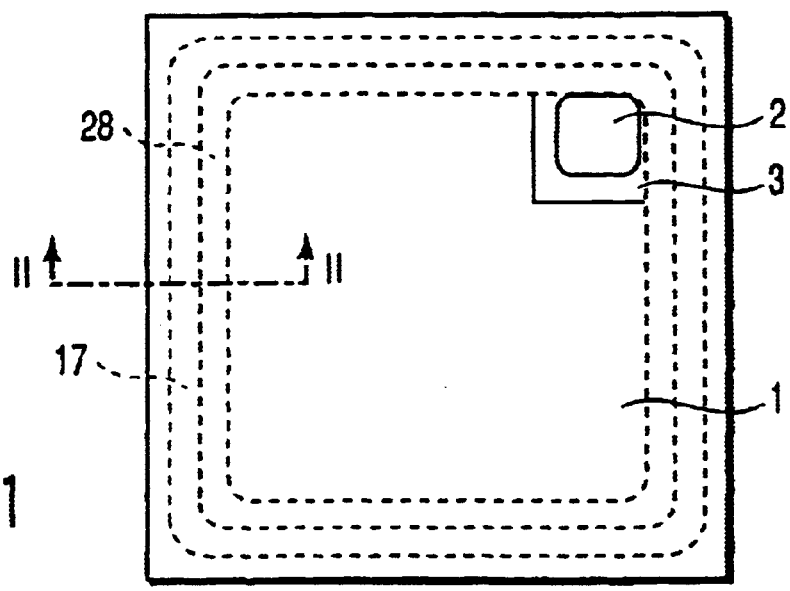
FIG. 1 is a top view perspectively showing a pattern layout on a semiconductor chip according to a first embodiment of the invention.

FIG. 1 is a top view of a pattern layout on a semiconductor chip according to a first embodiment of the invention.

In the semiconductor chip shown in FIG. 1, an SBD-forming region 28 is provided such that it completely surrounds a FET-forming region 14 in which a MISFET is to be formed. On the top surface of the chip, a first common main electrode 1, which serves as both the source electrode of the NMISFET and the anode of a Schottky barrier diode (SBD) formed in the SBD-forming region, is provided. On the top surface of the chip, a surface gate electrode 2 of the NMISFET is also provided, isolated from the first main electrode 1 by an insulation film 3. On the reverse surface of the chip, a second common main electrode (not shown), which serves as both the drain electrode of the NMISFET and the cathode of the SBD, is provided.

Figure 2:
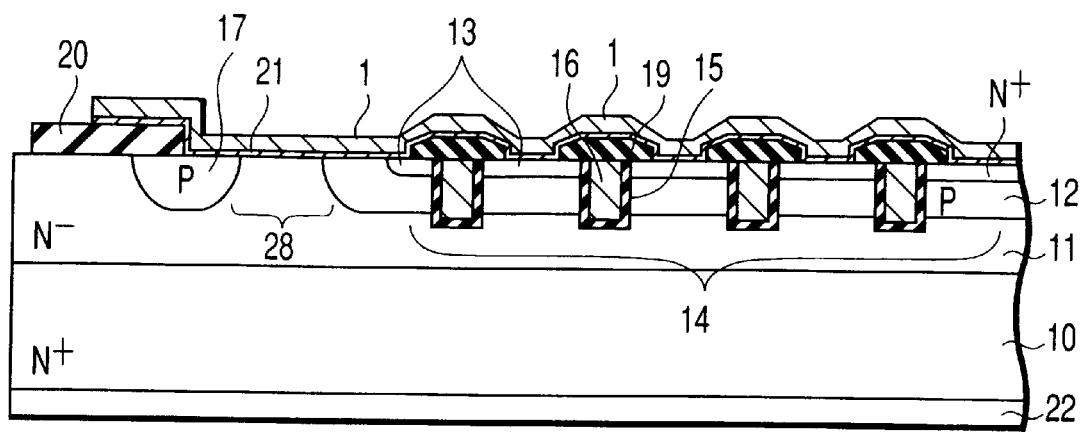
FIG. 2 is a schematic sectional view taken along line II—II of FIG. 1, illustrating several cells incorporated in an NMISFET of a trench gate structure and an SBD provided on an N+/N− substrate.

FIG. 2 is a schematic sectional view taken along line II—II of FIG. 1. Specifically, it shows several NMISFET cells of the trench gate structure and the SBD provided on an N+/N− substrate that is obtained by growing an epitaxial N− layer 11 on an N+ semiconductor substrate 10.

In FIG. 2, a P base layer 12 as the FET-forming region is provided in the N− layer 11 of the N+/N− substrate, and N+ source regions 13 are provided in the P base layer 12. Further, gate trenches extend from the surfaces of the N+ source regions 13 to the N− layer 11.

Further, a gate insulation film 15 is provided on the inner wall of each gate trench, and a trench gate electrode 16 of impurity-doped polysilicon is buried in each trench. In other words, each N+ source region 13 is formed in the P base layer 12 interposed between adjacent gate trenches, such that it is in contact with the side surface of each gate trenches. More specifically, the N+ source regions 13, gate trenches and trench gate electrodes 16 in the P base layer 12 are provided in, for example, a plurality of stripe-shaped flat patterns. Polysilicon gate wiring layer (not shown) connected to the trench gate electrodes 16 extends to a position apart from the gate trench array.

The aforementioned SBD-forming region 28 is provided, for example, around the entire P base layer 12 of the FET-forming region 14. Further, a P guard ring region 17 is provided in the N− layer 11 along the periphery of the chip such that it surrounds the SBD-forming region 28. The P guard ring region 17 and P base layer 12 are formed in the same process.

An interlayer insulation film 19 is provided on the substrate in the FET-forming region 14, and contact holes are formed in predetermined portions of the film 19. Further, an oxide film 20 is provided on the portion of the substrate, which includes part of the guard ring region 17.

A barrier metal 21 is continuously provided over part of the guard ring region 17, the N− layer 11 in the SBD-forming region 28, part of each N+ source region 13, and part of the P base layer 12.

In this structure, the barrier metal 21 is in Schottky contact with the N− layer 11 in the SBD-forming region 28, and in ohmic contact with the N+ source regions 13 (high density region) and P base layer 12 (high density region). Furthermore, the barrier metal 21 serves as a barrier when an electrode-forming metal (such as aluminum) is provided on the metal 21 and then annealed, as will be described later.

In addition, the aforementioned first main electrode 1 made of a metal, which serves as both the SBD anode and FET source electrode, is provided on the barrier metal 21.

Further, the surface gate electrode 2 is provided on the polysilicon gate wiring layer (not shown) in the FET-forming region 14. The surface gate electrode 2 is located on the top surface of the substrate surrounded by the guard ring region 17, and is isolated from the first main electrode 1 by the interlayer insulation film 3 provided on the top surface. On substantially the entire reverse surface of the chip, a second common main electrode 22, which serves as both the FET drain electrode and SBD cathode, is provided.

Figure 8:
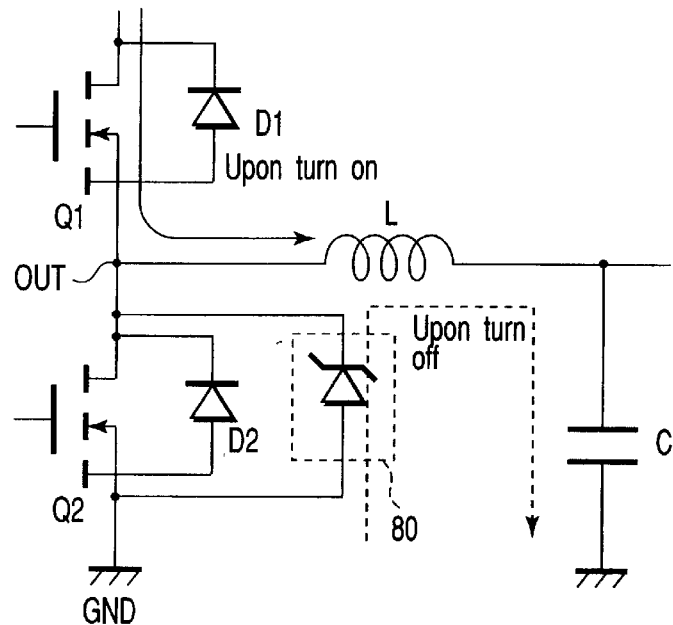
FIG. 8 is a circuit illustrating the connection of a synchronization rectifier circuit and load circuit.
Figure 9:
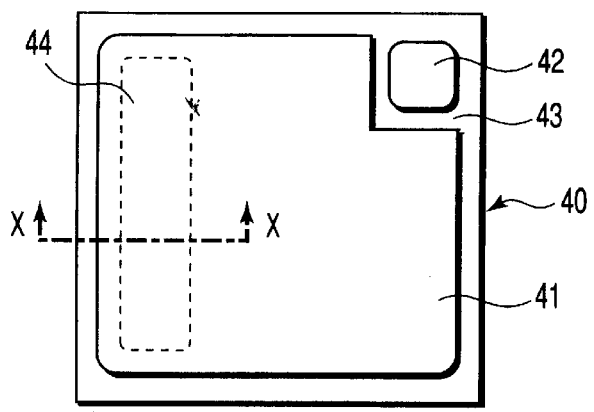
FIG. 9 is a top view perspectively showing a pattern layout on a conventional semiconductor chip with an NMISFET and an SBD.

The semiconductor chip including the NMISFET and SBD as shown in FIG. 2 has a circuit structure equivalent to the circuit shown in FIG. 8 in which the "L" side transistor Q2 and SBD 80 are connected in parallel. This circuit operates in the following manner.

The drain current flowing from the FET drain electrode (second main electrode 22) to the source electrode (first main electrode 1) is ON/OFF controlled by a control voltage applied to the surface gate electrode 2.

Specifically, when a predetermined control voltage is applied to the surface gate electrode 2 while a predetermined voltage is applied between the drain and source electrodes of the "L" side transistor Q2, a drain current flows through an inversion layer formed on the surface portion (channel region) of the P base layer that abuts against each gate trench. Since at this time, a reverse bias voltage is applied to the SBD 80, the SBD is in the OFF state. However, a depletion layer extending from the P base layer 12 to the outside (toward the SBD) and other depletion layer extending from the guard ring region 17 to the inside (toward the SBD) relieve the intensity of the electric field that occurs in the SBD junction, thereby reducing the leak current of the SBD.

On the other hand, when the supply of the voltage to the surface gate electrode 2 is stopped, the "L" side transistor Q2 becomes OFF. If, in this state, a predetermined forward bias voltage is applied between the source electrode 1 and drain electrode 22 of the "L" side transistor Q2 (i.e., between the anode 1 and cathode 22 of the SBD), a forward current flows through the parasitic PN diode (D1 in FIG. 7) of the "L" side transistor Q2 and SBD 80, thereby turning on the FET and SBD.

Figure 3:
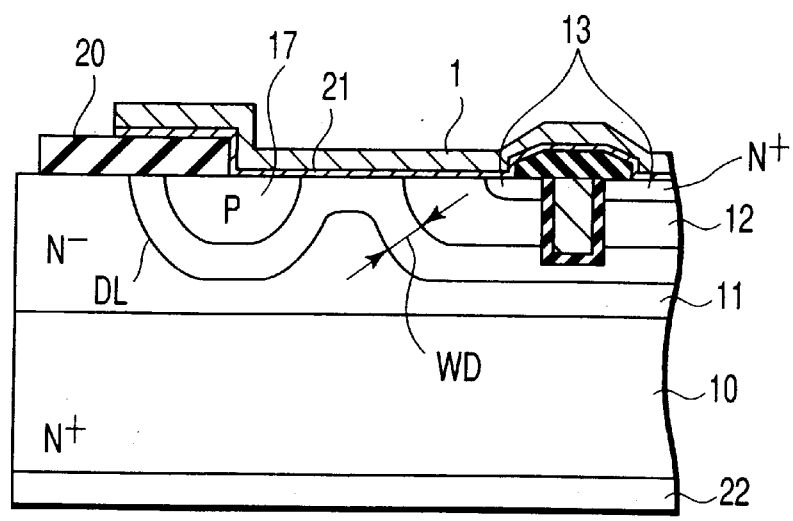
FIG. 3 is a sectional view illustrating a depletion layer occurring when an MISFET is operating.

When the MISFET is operating, i.e., when a reverse bias voltage is applied to the SBD 80, a depletion layer DL mainly extends to the N⁻ layer 11 from the P base layer 12, P guard ring region 17 and the barrier metal 21 that forms the Schottky contact as shown in FIG. 3, thereby causing a pinch-off state. The width WD of the depletion layer is given by $$WD \propto \{(V+Vd)/Nd\}^{1/2}$$

where V represents the reverse bias voltage, Vd a diffusion potential at the zero bias, and Nd the impurity concentration of the N⁻ layer 11. Thus, the SBD-forming region 28 is depleted, i.e., its electric field intensity is relieved. As a result, the leak current of the SBD barrier region is reduced and the reverse loss is reduced.

FIG. 4 shows the leak currents that occur when a rated voltage (e.g., 30 V) is applied between the drain and source electrodes employed in the semiconductor devices of FIGS. 2 and 10.

The leak current of the semiconductor device shown in FIG. 2 is substantially 50 μA as indicated by the solid line in FIG. 4. This value is approx. ⅑ of the leak current of the semiconductor device shown in FIG. 10 (substantially 450 μA as indicated by the broken line in FIG. 4).

When the semiconductor chip shown in FIG. 2 is mounted on a SOP-type package, the second main electrode 22 on the reverse surface of the chip is mounted on a bed 31 of a lead frame 30, with the surface gate electrode 2 of the FET positioned close to the inner leads 32 of the lead frame 30, as is shown in FIGS. 5A and 5B, in a manner similar to the case of FIGS. 11A and 11B. Thus, the second main electrode 22 is connected to the drain/cathode terminal (not shown) via the lead frame 30.

Further, the surface gate electrode 2 and first main electrode 1 are bonded to the inner leads 32 of the lead frame 30 by bonding wires 33. A plurality of bonding wires 33 are used to bond the first main electrode 1 to the inner lead 32 in order to reduce the wiring resistance and increase the current capacity. As a result, the surface gate electrode 2 and first main electrode 1 are connected to the gate terminal (not shown) and source/anode terminal (not shown), respectively.

Thereafter, the semiconductor chip, and the bed 31 of the lead frame 30, inner leads 32 and bonding wires 33 are covered with a molded resin (not shown), whereby they are packaged and cut into an individual semiconductor device.

In the above-described package structure, the bonding wires 33 connecting the first main electrode 1 to the lead frame may be bonded to the end portion of the first main electrode 1 close to the inner leads 32.

However, since the SBD-forming region surrounds the P base layer 12 located in the FET-forming region, and the anode on the SBD-forming region is also located at the end portion of the first main electrode 1 close to the inner leads 32, the electrical resistance of the portion extending from the anode portion to the inner leads 32 will not be increased. Therefore, a relatively large voltage drop will not occur when the forward current flows through the SBD. Further, when the forward current flows through the SBD, it flows uniformly through the SBD-forming region that surrounds the FET-forming region, and hence the characteristics of the FET cells are expected to be better balanced.

The semiconductor device according to the first embodiment is used in the synchronization rectifier circuit shown in FIG. 8. The synchronization rectifier circuit using this semiconductor device operates basically in the same manner as the conventional semiconductor device described with reference to FIG. 8.

In the synchronization rectifier circuit shown in FIG. 8, the rated current of the NMISFET Q2 is generally larger than that of the SBD 80, and the SBD 80 can be made to a relatively small area. For example, where approx. 6A is necessary as the rated current of the SBD 80, it is sufficient if the rated current of the SBD 80 is set to approx. 1A. Accordingly, if, for example, the square pattern size of the P base layer 12 of the NMISFET Q2 is 2 mm×2 mm, the desired rated current can be obtained by setting the SBD region 28 to a width of 150 μm.

In other words, in the semiconductor device according to the first embodiment, where the semiconductor chip is mounted on the lead frame and packaged, the electrical resistance of the portion, extending from the anode 1 of the SBD to the inner leads 32 and then to the source/anode terminal, can be reduced, thereby reducing a voltage drop that occurs when the forward current flows through the SBD, and better balancing the characteristics of the FET cells.

A second embodiment will now be described.

In the above-described first embodiment, if a relatively large rated current is required for the SBD, it is necessary to increase the width of the Schottky junction so as to increase the effective area of the SBD. This may reduce the effect of relieving the intensity of the electric field of the SBD junction by the depletion layer outwardly extending from the P base layer 12 and the depletion layer inwardly extending from the guard ring region 17. To overcome this problem, the second embodiment employs the pattern layout shown in FIG. 1, but a different SBD structure.

FIG. 6 is a schematic sectional view, similar to FIG. 2, illustrating a structure including several NMISFET cells and an SBD.

In this semiconductor device, a plurality of terminated guard ring regions 40 are provided at regular intervals in the N⁻ layer 11 of the SBD-forming region 28, the P base layer 12 and the guard ring region 17.

In each guard ring region 40, a P-type layer (e.g., polysilicon 41 doped with a P-type impurity) is buried in a trench, and a high impurity concentration layer (P⁺ layer) 42 is provided around the polysilicon 41.

Each guard ring region 40 is formed, for example, by forming the trench in the N⁻ layer 11, burying polysilicon 41 therein, implanting, for example, boron ions and annealing. For more particulars concerning the method for forming the guard ring region 40 in the SBD semiconductor layer, see Japanese Patent Application No. 8-193415 (Jpn. Pat. Appln. KOKAI Publication No. 10-41527) filed by the same applicant as the present application.

The semiconductor device provided as above operates basically in the same manner as that of the first embodiment.

Further, in the second embodiment, since the Schottky junction is surrounded by the guard ring regions 40 arranged at optimal intervals, the depletion layer extending from each guard ring region 40 relieves the intensity of the electric field of the SBD junction to thereby further reduce the leak current of the SBD, when a reverse bias is applied to the SBD.

The guard ring regions 40 are not limited to the trench structure, but may comprise P-type diffusion layers formed in the same process as the P base layer 12.

Figure 7A:
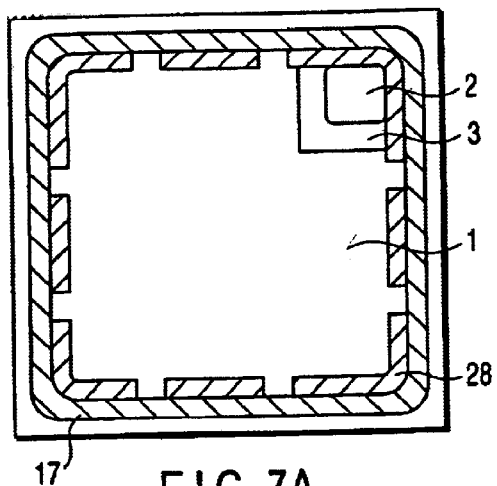
FIGS. 7A and 7B are top views illustrating pattern layout modifications.
Figure 7B:
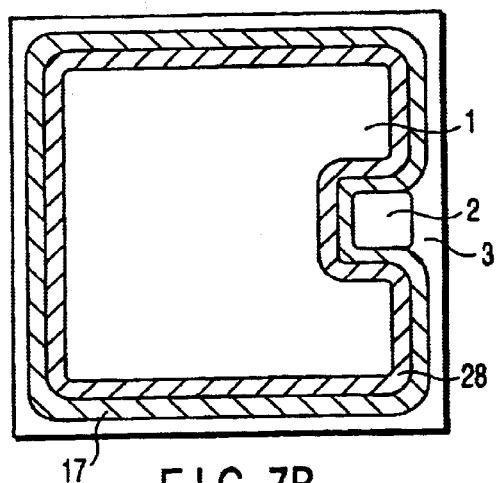

FIGS. 7A and 7B are top views illustrating modifications of the pattern layout of the above-described semiconductor device.

In the pattern layout shown in FIG. 7A, the SBD-forming region is divided into a plurality of regions in the N⁻ layer 11 such that they intermittently surround the P base layer 12 of the FET-forming region, which differs from the pattern layout of FIG. 1.

In the pattern layout shown in FIG. 7B, the surface gate electrode 2 is led to the substrate top surface, and is located outside the region surrounded by the guard ring region 17, isolated from the first main electrode 1.

The MISFET region of the above semiconductor device is not limited to the trench gate structure, but may have a planar gate structure.

In addition, although the above-described semiconductor devices employ the second main electrode 22 provided on the reverse surface of the chip, the second main electrode 22 may be omitted by employing the following structure. That is, a conductive portion (not shown) is extended from the N⁺ layer 10 to, for example, an end portion of the top surface of the chip, and a second main electrode is formed on the top surface of the chip such that it is connected to the conductive portion.

In this case, the conductive portion is realized by forming an electrode-leading trench that extends through the N⁻ layer 11 to the N⁺ layer 10, and burying a low resistance electrode material (e.g. a metal or low resistance polysilicon) in the trench. As the electrode material, a high impurity concentration silicon layer of the same conductivity type as the N⁺ layer 10 may be used.

In the semiconductor device in which all electrodes are provided on the top surface of the chip, it is easy to connect the wires to external connection terminals when the device is packaged.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor layer of a first conductivity type provided on a semiconductor substrate of the first conductivity type;
   a base layer of a second conductivity layer provided in the first semiconductor layer, the base layer defining a vertical MISFET including a plurality of source regions and gate electrodes, each of the gate electrodes being provided on a gate insulation film;
   a Schottky barrier diode (SBD)-forming region provided in the first semiconductor layer to surround the base layer;
   a guard ring region of the second conductivity type provided to surround the SBD-forming region;
   a first main electrode disposed above the first semiconductor layer to cover both the SBD-forming region and the source regions, the first main electrode being provided in common as a source electrode of the MISFET and an anode of the SBD;
   a surface gate electrode disposed above the first semiconductor layer to be isolated from the first main electrode by an insulation film, the surface gate electrode being electrically connected to the gate electrodes; and
   a second main electrode provided in common as both a drain electrode of the MISFET and a cathode of the SBD.

2. The semiconductor device according to claim 1, wherein the SBD-forming region is arranged to surround continuously the base layer.

3. The semiconductor device according to claim 2, wherein the guard ring region is provided to surround the SBD-forming region.

4. The semiconductor device according to claim 2, wherein the first main electrode is provided on a barrier metal via contact holes of the insulation film and comprised of a metal connected to the source regions and the base layer.

5. The semiconductor device according to claim 4, wherein the barrier metal is continuously provided on part of the guard ring regions, on part of the surface of the source regions through the contact holes formed in the insulation film, and on part of the surface of the base layer.

6. The semiconductor device according to claim 2, wherein the second main electrode is provided over an opposite surface of the semiconductor substrate.

7. The semiconductor device according to claim 2, further comprising a plurality of terminated guard ring regions, provided at predetermined intervals in the first semiconductor layer of the SBD-forming region, having the second conductivity type.

8. The semiconductor device according to claim 7, wherein a conductor having the second conductivity type is buried in each of trenches selectively formed at predetermined intervals to provide the terminated guard ring regions.

9. The semiconductor device according to claim 2, wherein the surface gate electrode is provided above the first semiconductor layer within a region surrounded by the guard ring region.

10. The semiconductor device according to claim 2, wherein the gate electrode is a trench gate electrode buried in a gate trench covered with the gate insulation film, the gate trench being formed down to the first semiconductor layer from the surface of the source regions through the base layer.

11. The semiconductor device according to claim 1, wherein the SBD-forming region is arranged to surround intermittently the base layer.

12. The semiconductor device according to claim 11, wherein the guard ring region is provided to surround the SBD-forming region.

13. The semiconductor device according to claim 11, wherein the first main electrode is provided on a barrier metal via contact holes of the insulation film and comprised of a metal connected to the source regions and the base layer.

14. The semiconductor device according to claim 13, wherein the barrier metal is continuously provided on part of the guard ring region, on part of the surface of the source regions through the contact holes formed in the insulation film, and on part of the surface of the base layer.

15. The semiconductor device according to claim 11, wherein the second main electrode is provided over an opposite surface of the semiconductor substrate.

16. The semiconductor device according to claim 11, further comprising a plurality of terminated guard ring regions, provided at predetermined intervals in the first semiconductor layer of the SBD-forming region, having the second conductivity type.

17. The semiconductor device according to claim 16, wherein a conductor having the second conductivity type is buried in each of trenches selectively formed at predetermined intervals to provide the terminated guard ring regions.

18. The semiconductor device according to claim 11, wherein the surface gate electrode is provided above the first semiconductor layer within a region surrounded by the guard ring region.

19. The semiconductor device according to claim 11, wherein the gate electrode is a trench gate electrode buried in a gate trench covered with the gate insulation film, the gate trench being formed down to the first semiconductor layer from the surface of the source regions through the base layer.

20. A semiconductor device comprising:
   a first semiconductor layer of a first conductivity type provided on a semiconductor substrate of the first conductivity type;
   a base layer of a second conductivity layer provided in the first semiconductor layer, the base layer defining a vertical MISFET including a plurality of source regions and a gate electrode provided on a gate insulation film;
   a Schottky barrier diode (SBD)-forming region provided in the first semiconductor layer around the base layer;
   a guard ring region of the second conductivity type provided around the SBD-forming region;
   a first main electrode disposed above the first semiconductor layer to cover both the SBD-forming region and the source regions, the first main electrode being provided in common as a source electrode of the MISFET and an anode of the SBD;
   a surface gate electrode disposed above the first semiconductor layer to be isolated from the first main electrode by an insulation film, the surface gate electrode being electrically connected to the gate electrodes; and
   a second main electrode provided in common as both a drain electrode of the MISFET and a cathode of the SBD,
   wherein the SBD-forming region is arranged to surround intermittently the base layer.

21. The semiconductor device according to claim 20, wherein the guard ring region is provided to surround the SBD-forming region.

22. The semiconductor device according to claim 20, wherein the first main electrode is provided on a barrier metal via contact holes of the insulation film and comprised of a metal connected to the source regions and the base layer.

23. The semiconductor device according to claim 22, wherein the barrier metal is continuously provided on part of the guard ring region, on part of the surface of the source regions through the contact holes formed in the insulation film, and on part of the surface of the base layer.

24. The semiconductor device according to claim 20, wherein the second main electrode is provided over an opposite surface of the semiconductor substrate.

25. The semiconductor device according to claim 20, further comprising a plurality of terminated guard ring regions, provided at predetermined intervals in the first semiconductor layer of the SBD-forming region, having the second conductivity type.

26. The semiconductor device according to claim 25, wherein a conductor having the second conductivity type is buried in each of trenches selectively formed at predetermined intervals to provide the terminated guard ring regions.

27. The semiconductor device according to claim 20, wherein the surface gate electrode is provided above the first semiconductor layer within a region surrounded by the guard ring region.

28. The semiconductor device according to claim 20, wherein the gate electrode is a trench gate electrode buried in a gate trench covered with the gate insulation film, the gate trench being formed down to the first semiconductor layer from the surface of the source regions through the base layer.

* * * * *